(12) United States Patent
Mostarshed et al.

(10) Patent No.: US 7,576,550 B2
(45) Date of Patent: Aug. 18, 2009

(54) AUTOMATIC MULTIPLEXING SYSTEM FOR AUTOMATED WAFER TESTING

(75) Inventors: Shahriar Mostarshed, San Mateo, CA (US); Michael L. Anderson, San Jose, CA (US)

(73) Assignee: Qualitau, Inc., Sunnyvale, CA (US)

(*) Notice: Subject to any disclaimer, the term of this patent is extended or adjusted under 35 U.S.C. 154(b) by 27 days.

(21) Appl. No.: 11/694,486

(22) Filed: Mar. 30, 2007

(65) Prior Publication Data

US 2008/0238451 A1  Oct. 2, 2008

(51) Int. Cl.
*G01R 31/02* (2006.01)

(52) U.S. Cl. .................. 324/754; 324/765

(58) Field of Classification Search ......... 324/754–765, 324/158.1
See application file for complete search history.

(56) References Cited

U.S. PATENT DOCUMENTS

| | | | |
|---|---|---|---|
| 2,951,242 A | | 8/1960 | Fischer et al. |
| 4,348,759 A | * | 9/1982 | Schnurmann ............... 714/724 |
| 5,224,104 A | * | 6/1993 | Iyaguchi .................... 714/743 |
| 5,701,306 A | | 12/1997 | Arai |
| 6,201,383 B1 | * | 3/2001 | Lo et al. .................... 324/73.1 |
| 6,541,791 B2 | * | 4/2003 | Chang ........................ 257/48 |
| 6,847,203 B1 | * | 1/2005 | Conti et al. .............. 324/158.1 |
| 6,927,593 B2 | * | 8/2005 | Kline .......................... 324/765 |
| 6,971,045 B1 | * | 11/2005 | Deb et al. ...................... 714/30 |
| 7,321,998 B2 | * | 1/2008 | Her et al. ..................... 714/724 |
| 2005/0193306 A1 | | 9/2005 | Luff et al. |

OTHER PUBLICATIONS

U.S. Appl. No. 11/270,371, filed Nov. 8, 2005, entitled "Semi Automatic Multiplexing System".
International Search Report in corresponding PCT Application PCT/US07/80389 mailed Mar. 28, 2008.
Written Opinion in corresponding PCT Application PCT/US07/80389 mailed Mar. 28, 2008.

* cited by examiner

*Primary Examiner*—Ha Tran T Nguyen
*Assistant Examiner*—Arleen M Vazquez
(74) *Attorney, Agent, or Firm*—Beyer Law Group LLP

(57) ABSTRACT

A parametric test system is for testing devices in dice in a semiconductor wafer, each die having a plurality of pads for electrically connecting to the device in the die. A tester of the system has a plurality of input/output lines for providing and receiving electrical signals during a device test. Multiplexer circuitry of the test system includes a plurality of networks of automated switches. The multiplexer circuitry is configured to receive electrical signals on the input lines from the tester and to provide the electrical signals to a wafer prober, wherein the multiplexer circuitry is configured to restrict how the electrical signals can be provided to the networks of automated switches. As a result of the multiplexer being configured to restrict how the electrical signals can be provided to the networks of automated switches, the configuration of the networks of automated switches can be simplified.

8 Claims, 2 Drawing Sheets

AUTOMATIC MULTIPLEXING SYSTEM FOR AUTOMATED WAFER TESTING

BACKGROUND

In automated parametric testing of semiconductor devices, there is a desire to collect large amounts of data from devices on wafers using a minimum set of expensive parametric test equipment shared amongst large numbers of devices. This is generally achieved by switching or multiplexing the parametric test equipment output amongst device inputs across the whole wafer, one at a time. For example, an external multiplexer may reside on top of a probe card on a wafer prober, which makes contact with a probe card through pogo pins. Conventional solutions to multiplexing the signals on top of the probe card, on the wafer prober, can use a large number of relays and switches in the construction of the multiplexer, which can be unnecessarily expensive.

FIG. 1 schematically illustrates such a conventional arrangement for testing devices on a wafer 112. Referring to FIG. 1, a parametric tester 102 has N source lines 104 connected through a pin multiplexer 106, which selects pins of a wafer prober 108 to receive the N source lines. Typically the pin selection will vary for different devices (i.e., circuit layouts) in a semiconductor wafer under control of computer 110.

For example, a conventional automatic switch matrix multiplexer may utilize N relays (the number of outputs required) per M inputs (M×N total relays). For a 4 input multiplexer, multiplexing into forty eight outputs would use 4×48 relays.

U.S. patent application Ser. No. 11/270,371, filed Nov. 8, 2005 and entitled "Semi Automatic Multiplexing System" describes an example parametric test system in which four inputs are switched into banks of four jumpers which then make manual connectivity with four of forty eight possible outputs. In this system, the input sources can only be connected to a corresponding jumper output position. For example, input 1 can only be connected to output 1 of banks 1 through 12 (in the case of 48 outputs), input 2 can only be connected to output 2 of banks 1 through 12 and so on. Each relay, though, can be actuated independently. This way, a reduction of expensive relays can be achieved but yet no flexibility is lost or sacrificed. A trivial case of this scheme is when the four input sources are hardwired to four outputs that have all forty eight outputs run across them and connected manually to the four inputs by manually placing jumpers at the grid intersections. This way, the multiplexer can be completely manual and operate without relays.

SUMMARY

A parametric test system is for testing devices in dice in a semiconductor wafer, each die having a plurality of pads for electrically connecting to the device in the die. A tester of the system has a plurality of input/output lines for providing and receiving electrical signals during a device test. A wafer prober has probe contacts for engaging pads on a die.

Multiplexer circuitry of the test system includes a plurality of networks of automated switches. The multiplexer circuitry is configured to receive electrical signals on the input lines from the tester and to provide the electrical signals to the wafer prober, wherein the multiplexer circuitry is configured to restrict how the electrical signals can be provided to the networks of automated switches.

For example, the multiplexer circuitry being configured to restrict how the electrical signals can be provided to the networks of automated switches includes the multiplexer circuitry being configured such that, for each of the plurality of networks of automated switches, the inputs are divided into groups and, for each group, the manner in which each member of that group can be provided to each of the plurality of networks of automated switches is constrained as compared to the manner in which each other member of that group can be provided to that network of automated switches.

As a result of the multiplexer being configured to restrict how the electrical signals can be provided to the networks of automated switches, the configuration of the networks of automated switches can be simplified.

DETAILED DESCRIPTION

The inventors have realized that the jumper cards in the Semiautomatic Multiplexer may be replaced with relay cards, to multiplex each set of four output connections. As discussed in the Background, in a conventional multiplexer, the automated switching of eight inputs into forty eight outputs would use 8×48(=384) relays. Using the technique disclosed in U.S. patent application Ser. No. 11/270,371, discussed above, only 2×48(=96) relays may be used, with the remainder of the "scrambling" taking place at the outputs, manually.

Figure 1:
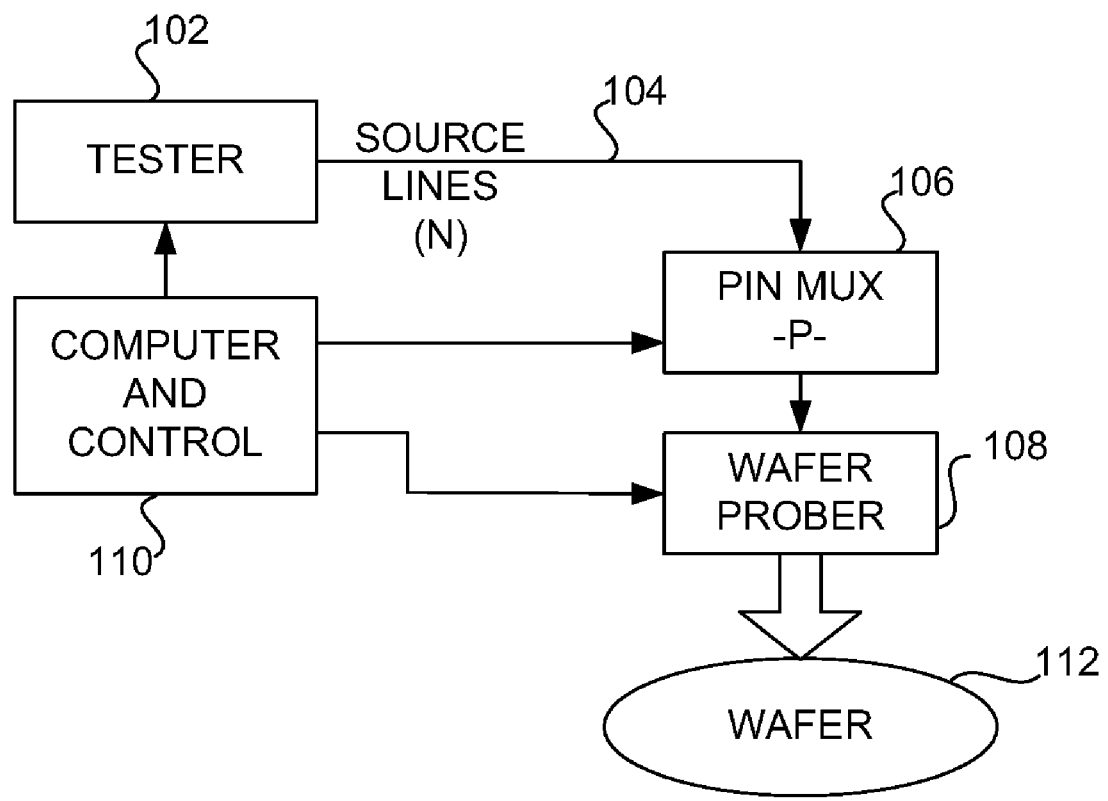
FIG. 1 illustrates such a conventional arrangement for testing devices on a wafer.
Figure 2:
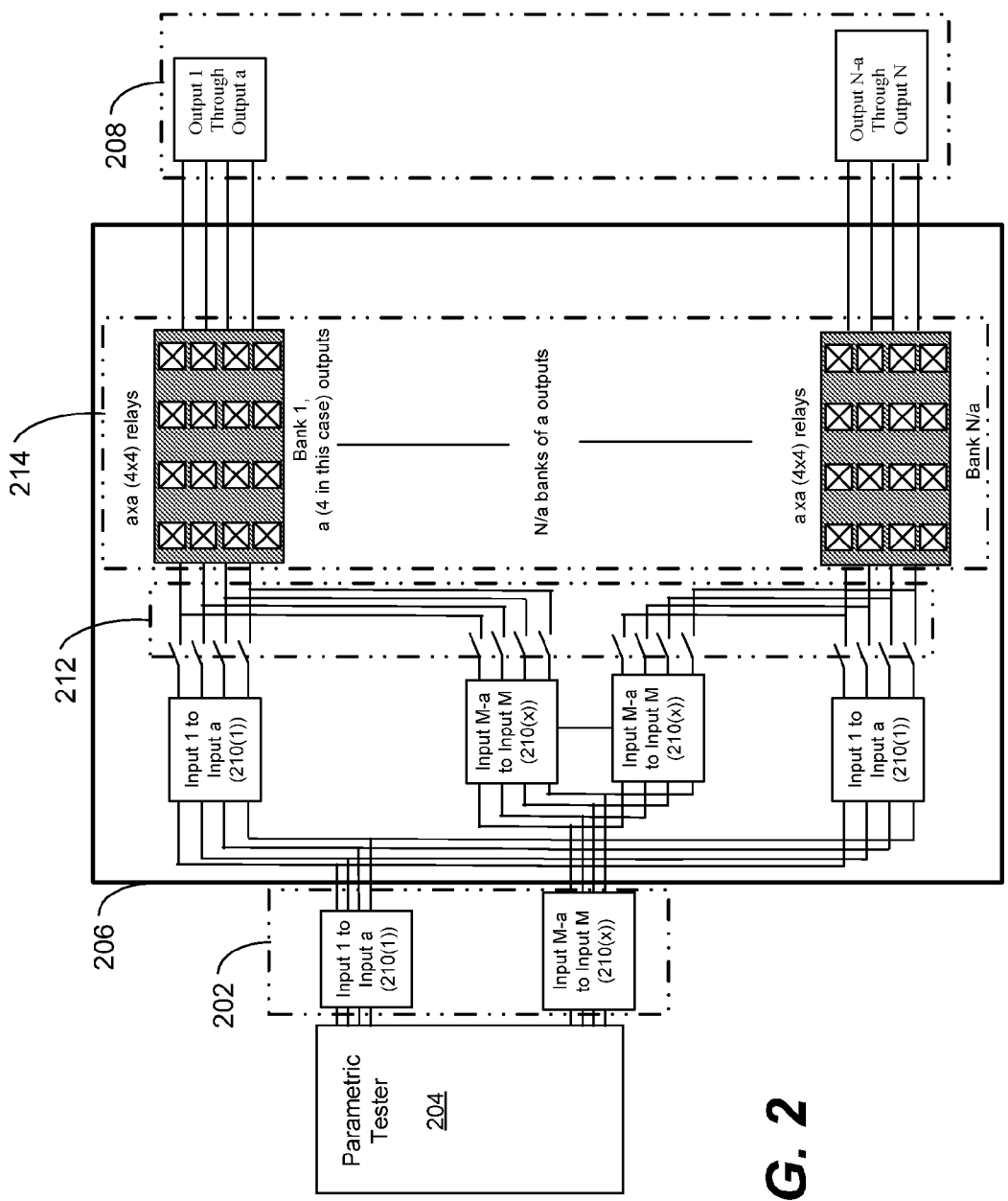
FIG. 2 illustrates a pin multiplexer comprised of relays and in which the outputs and inputs are divided into groups with restrictions on the number of ways each input of a group can interact with a relay bank.

In accordance with an aspect, an example of which is illustrated in FIG. 2, the outputs and inputs are divided into groups with restrictions on the number of ways each input of a group can interact with each of a plurality of networks of automated switches, such as relay banks. The input side may be thought of as being very similar to the input side as described in U.S. patent application Ser. No. 11/270,371. As a result of the division into groups with restrictions on the number of ways each input of a group can interact with a relay bank, there may be tremendous savings on the number of relays used to achieve full multiplexing or connectivity of all inputs to all outputs.

Referring now to FIG. 2, a plurality of inputs 202 are provided from a parametric tester 204 to a pin multiplexer 206, which selects pins of a wafer prober to receive the N source lines (shown as outputs 208 in FIG. 2). The inputs 202 are provided in groups (210(1) to 210(x)) to switches (collectively, 212). The switches serve to switch the inputs 202 into banks 214 of relays. (FIG. 2 represents that there are a total of N/a banks 214 of relays, where "a" is the number of inputs in each group 210 of inputs and "N" is the number of outputs. Only bank 1 and bank N/a are explicitly shown in FIG. 2, whereas the remaining banks 2 to N/a−1, if present at all, are implicitly shown.) The inputs are switched in groups such that the number of ways an input of each group of switches 212 can be switched is limited to the number of banks.

More particularly, in the FIG. 2 example, the first input of a group (e.g., input 1 of group 210(1)) is switched into the first input of any one of the banks 214, the second input of group 210(1) is switched into the second output of any one of the banks 214, and so on. Put another way, the first input of group cannot make a connection with any other input in a bank 214 other than with the first input in that bank, the second input of a group cannot make any connection with any other input in a bank 214 other than with the second input in that bank, and so on.

We now discuss the banks 214 of relays in particular. The outputs within each bank are mutilplexed such that all the inputs to that bank can make contact with all the outputs of that bank. Thus, the number of relays used for one bank is the number of outputs of that bank, squared (all possible combinations of connectivity for the outputs in a bank).

Thus, for example, for an eight input system (M=8) multiplexed into forty eight outputs (N=48) with banks of four outputs (a=4), there are N/a (i.e., 48/4=12) banks of four outputs each. Each of the two groups of four inputs corresponds to forty eight relays, to connect to all forty eight outputs four at a time, for a total of 2×48(=96) relays for the two groups of four inputs. For each of the twelve banks of relays, 4×4(=16) relays are utilized to multiplex the outputs for that bank of relays.

As a result, for the example eight input system multiplexed into forty eight outputs with banks of four outputs, the total number of relays utilized are (2×48)+(12×16) or 6×48. This yields a savings of 2×48 relays as compared with the conventional method described in the Background. The advantage of this scheme is that as the number of inputs is increased, the number of relays required becomes proportionately smaller at the added advantage of being able to connect all inputs, in parallel, to the selected outputs, remotely or automatically. As another example, for a 24 input system, with 48 outputs the number of relays required, in this scheme are: 48×6 (6 sets of 4 inputs for a total of 24 inputs)+16 (number of relays to multiplex 4 outputs)×12 (number of 4 output sets in a 48 output system) or 480. In the traditional scheme of multiplexing the same 24 inputs into 48 outputs 24×48=1152 relays would be required.

Having discussed a particular example, we now describe more generally the configuration of an M input system multiplexed into N outputs with banks of a outputs. That is, in general, the number of banks in such a system is described by N/a, but the number of ways the inputs can be divided into groups of a are M/a. The number of relays used to switch M/a input groups for N outputs are $$N * \frac{M}{a}.$$

The number of relays used to switch all combinations in each of N/a banks are $a^2$. The total number of relays, X is:

$$X = N * \frac{M}{a} + a^2 * \frac{N}{a} = \left(\frac{M}{a} + a\right)$$

The equation for X describes a curve that has a minimum at $$\frac{\partial X}{\partial a} = 0 = -\frac{M}{a^2} + 1.$$

Thus, $M=a^2$, since both the output and input numbers should be divisible by a.

The total number of relays for a 36 input system with 96 outputs according to the described configuration would be 96×(6+6)=1152, where as with a conventional system the number of relays would be 36×96=3456. The table below illustrates, according to the described configuration, a number of relays that would be used for a system having a particular number of outputs in a bank (row labels of table) and a particular combination of number of inputs and number of outputs (column labels of table).

| # outputs in a bank | # Input × # output | | | | | | | | | | |
|---|---|---|---|---|---|---|---|---|---|---|---|
| | 4 × 48 | 8 × 48 | 12 × 48 | 16 × 48 | 20 × 48 | 24 × 48 | 48 × 48 | 24 × 96 | 48 × 96 | 36 × 48 | 36 × 96 |
| 1 | 192 | 384 | 576 | 768 | 960 | 1152 | 2304 | 2304 | 4608 | 1728 | 3456 |
| 2 | 192 | 288 | 384 | 480 | 576 | 672 | 1248 | 1344 | 2496 | 960 | 1920 |
| 3 | 208 | 272 | 336 | 400 | 464 | 528 | 912 | 1056 | 1824 | 720 | 1440 |
| 4 | 240 | 288 | 336 | 384 | 432 | 480 | 768 | 960 | 1536 | 624 | 1248 |
| 6 | 320 | 352 | 384 | 416 | 448 | 480 | 672 | 960 | 1344 | 576 | 1152 |
| 8 | 408 | 432 | 456 | 480 | 504 | 528 | 672 | 1056 | 1344 | 600 | 1200 |
| 12 | 592 | 608 | 624 | 640 | 656 | 672 | 768 | 1344 | 1536 | 720 | 1440 |

The number of inputs, outputs, banks and sets of inputs and outputs used here are provided for illustration purposes only and the configuration can be used with other numbers of inputs, outputs, banks and sets of inputs and outputs.

It has been shown that, while the use of jumper blocks for manually programming probe connections to a parametric tester for the different devices on a wafer substantially reduces the use of multiplexer switches (as described in U.S. patent application Ser. No. 11/270,371), there are even automatic configurations that can reduce the use of relays.

What is claimed is:

1. A parametric test system for testing devices in dice in a semiconductor wafer, each die having a plurality of pads for electrically connecting to the device in the die, comprising:
   a) a tester having a plurality of input/output lines for providing and receiving electrical signals during a device test,
   b) a wafer prober having probe contacts for engaging pads on a die,
   c) multiplexer circuitry coupled to receive electrical signals on the input lines from the tester and to provide the electrical signals to the wafer prober, the multiplexer circuitry comprising
      a plurality of networks of automated switches, each network of automated switches having a plurality of inputs and a plurality of outputs and is configured such that any of the plurality of inputs to that network of automated switches may be connected to any of the plurality of outputs of that network of automated switches, and
      multiplexer input stage circuitry, wherein the multiplexer input stage circuitry provides the electrical signals from the tester to the networks of automated switches via the multiplexer input stage circuitry, the multiplexer input stage circuitry being configured such that each signal provided from the tester may be selectively electrically coupled to any one of the plurality of networks of automated switches but, for each network of automated switches, that signal can only be coupled to one predetermined input of that network of automated switches.

2. The parametric test system of claim 1, wherein:

the multiplexer input stage circuitry includes groups of input switches; and the multiplexer input stage circuitry includes input switches arranged such that the electrical signals from the tester are switched by the groups of input switches to be provided to the networks of automated switches so that each signal provided from the tester is selectively electrically coupled to any one of the plurality of networks of automated switches but, for each network of automated switches, that signal can only be coupled to one predetermined input of that network of automated switches.

3. The parametric test system of claim 2, wherein:

"M" is the number of input lines to the tester;

"N" is the number of output lines from the tester; and

"a" is a number of input lines to each group of input switches;

the multiplexer circuitry is configured such that there are M/a groups of input switches and N/a networks of automated switches.

4. The parametric test system of claim 1, wherein:

the networks of automated switches are banks of relays.

5. A method of operating multiplexer circuitry to multiplex test signals from a parametric tester, having a plurality of input/output lines for providing and receiving electrical signals during a device test, to pads of different devices in dice of a semiconductor wafer comprising the steps of:

by multiplexer input stage circuitry of the multiplexer circuitry, receiving electrical signals on the input lines from the tester, providing the received electrical signals to networks of automated switches of the multiplexer circuitry, via the multiplexer input stage circuitry, the multiplexer input stage circuitry being configured such that each signal provided from the tester may be selectively electrically coupled to any one of the plurality of networks of automated switches but, for each network of automated switches, that signal can only be coupled to one predetermined input of that network of automated switches; and controlling the automated switches of the multiplexer circuitry to cause each of the received electrical signals to be provided to a desired pad of one of the devices.

6. The multiplexer operating method of claim 5, wherein:

the multiplexer input stage circuitry includes groups of input switches; and providing the received electrical signals from the parametric tester to the networks of automated switches includes switching the electrical signals by the groups of the input switches to select to which network of automated switches each signal is to be provided and so that each received electrical signal is coupled to one predetermined input of a selected network of automated switches.

7. The multiplexer operating method of claim 6, wherein:

"M" is the number of input lines to the tester;

"N" is the number of output lines from the tester; and

"a" is a number of input lines to each group of input switches;

the multiplexer circuitry is configured such that there are M/a groups of input switches and N/a networks of automated switches.

8. The multiplexer operating method of claim 5, wherein:

the networks of automated switches are banks of relays.

* * * * *